(12) United States Patent
Chen

(10) Patent No.: US 8,300,413 B2
(45) Date of Patent: Oct. 30, 2012

(54) FIXING DEVICE AND HEAT SINK ASSEMBLY USING THE SAME

(75) Inventor: Song-Ya Chen, Shenzhen (CN)

(73) Assignees: Fu Tai Hua Industry (Shenzhen) Co., Ltd., ShenZhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 222 days.

(21) Appl. No.: 12/915,069

(22) Filed: Oct. 29, 2010

(65) Prior Publication Data

US 2011/0194257 A1 Aug. 11, 2011

(30) Foreign Application Priority Data

Feb. 5, 2010 (CN) .......................... 2010 1 0301284

(51) Int. Cl.
*H05K 7/20* (2006.01)

(52) U.S. Cl. .............. 361/704; 361/679.46; 361/679.54; 361/719; 165/80.3; 165/104.33; 165/185

(58) Field of Classification Search .......... 361/702–712, 361/719, 720; 165/80.3, 185, 104.33; 174/16.3, 174/252; 257/706–719, 722, 723, 727; 24/295–297, 24/453, 456–458, 508; 248/505, 510, 225.1, 248/205.1; 411/41, 518, 522, 505, 508–510, 411/544, 552, 913
See application file for complete search history.

(56) References Cited

U.S. PATENT DOCUMENTS

| | | | |
|---|---|---|---|
| 6,311,766 B1 * | 11/2001 | Lin et al. ...................... | 165/80.3 |
| 6,392,889 B1 * | 5/2002 | Lee et al. ...................... | 361/704 |
| 7,099,156 B2 * | 8/2006 | Chen et al. ...................... | 361/719 |
| 7,161,808 B2 * | 1/2007 | Atkinson ...................... | 361/719 |
| 7,430,122 B2 * | 9/2008 | Li ............... | 361/719 |
| 7,480,144 B2 * | 1/2009 | Li ............... | 361/704 |
| 7,606,032 B2 * | 10/2009 | Lin ............... | 361/709 |
| 7,796,390 B1 * | 9/2010 | Cao et al. ...................... | 361/704 |
| 7,869,217 B2 * | 1/2011 | Chen et al. ...................... | 361/710 |
| 7,972,101 B2 * | 7/2011 | Cheng ........................... | 411/522 |
| 8,002,020 B2 * | 8/2011 | Li et al. ...................... | 165/80.3 |

* cited by examiner

*Primary Examiner* — Michail V Datskovskiy
(74) *Attorney, Agent, or Firm* — Altis Law Group, Inc.

(57) ABSTRACT

A fixing device for fixing a first element to a second element is provided. The fixing device includes a main body including at least one leg, at least one biasing member movably mounted on the at least one leg for generating a compressive force. At least one hook member rotatably connected to an end of the at least one leg, cooperating with the biasing member to fix the first element to the second element. A heat sink assembly using the fixing device are also provided.

18 Claims, 6 Drawing Sheets

FIXING DEVICE AND HEAT SINK ASSEMBLY USING THE SAME

BACKGROUND

1. Technical Field

The present disclosure relates to fixing devices, and particularly to a fixing device for a heat sink.

2. Description of Related Art

A number of conventional fasteners, such as heat sink fasteners, are used to attach a first element to a second element. The fasteners extend through clearance holes in the first and second elements, and are constructed to exert a spring force that presses the first element against the second element. The fasteners that are presently used to fasten the first element to the second element are relatively difficult to assemble.

Therefore, there is room for improvement in the art.

BRIEF DESCRIPTION OF THE DRAWINGS

The components of the drawings are not necessarily drawn to scale, the emphasis instead being placed upon clearly illustrating the principles of the embodiments of a fixing device. Moreover, in the drawings, like reference numerals designate corresponding parts throughout several views.

DETAILED DESCRIPTION

Figure 1:
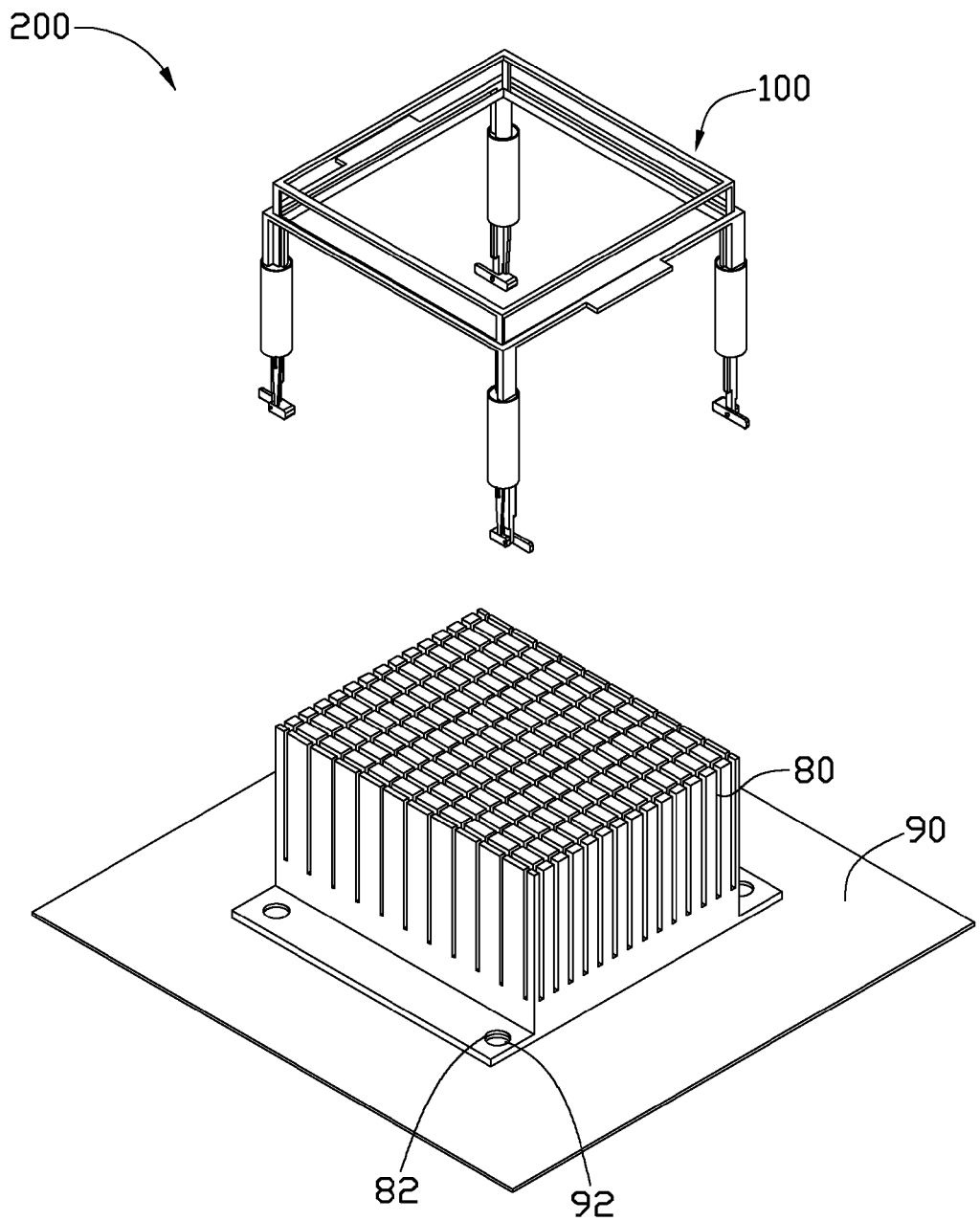
FIG. 1 is a perspective view of a heat sink assembly in accordance with one embodiment; the heat sink assembly includes a fixing device, a heat sink and a circuit board.

Referring to FIG. 1, a heat sink assembly 200 is shown. The heat sink assembly 200 includes a first element such as a heat sink 80, a second element such as a circuit board 90 and a fixing device 100. The fixing device 100 is used to fix the heat sink 80 to the circuit board 90.

The heat sink 80 defines a number of first holes 82. The circuit board 90 defines a number of second holes 92 corresponding to the first holes 82. The fixing device 100 fixes the first element 80 to the second element 90 by extending through the first holes 82 and the corresponding second holes 92.

Figure 2:
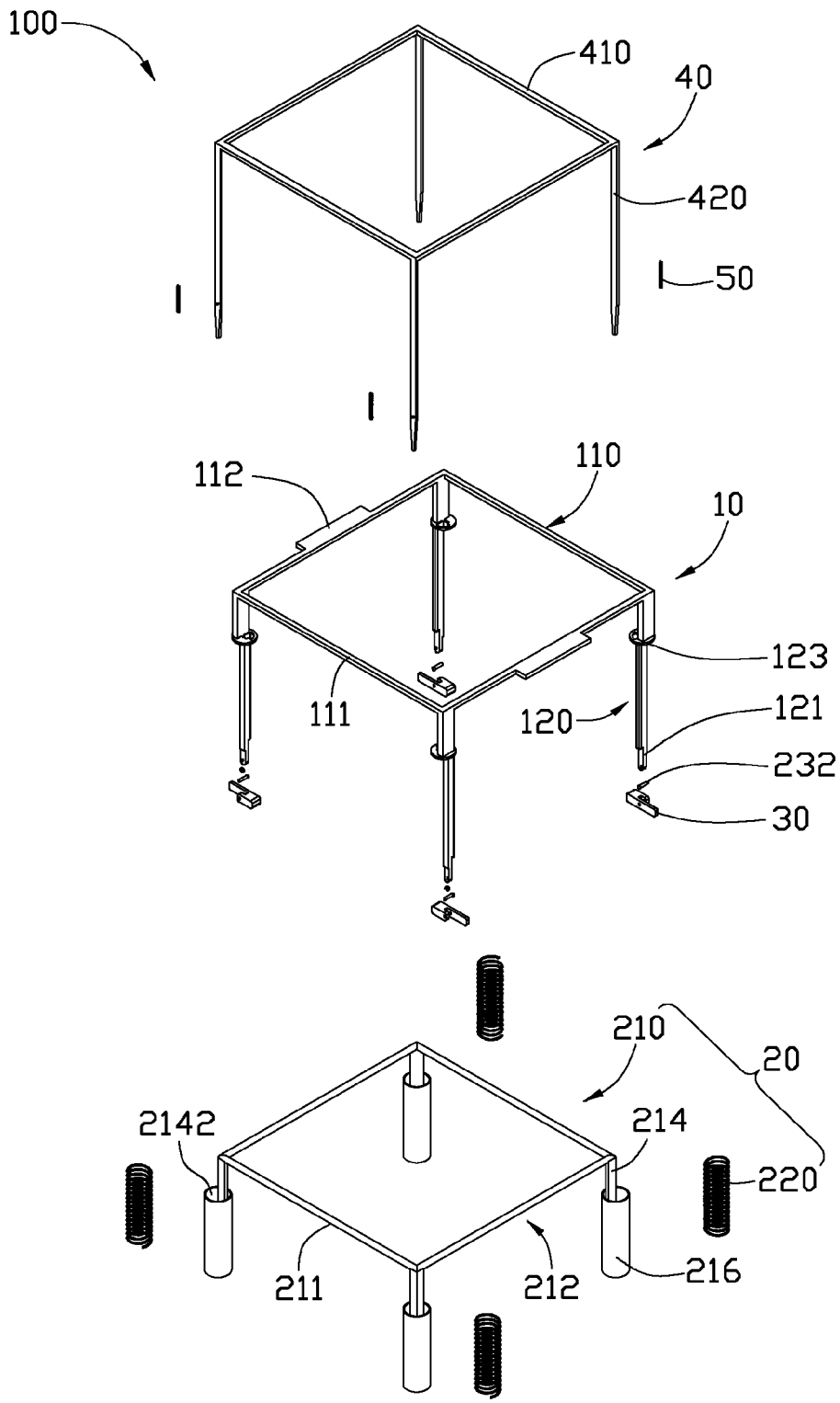
FIG. 2 is a disassembled perspective view of the fixing device in FIG. 1.
Figure 3:
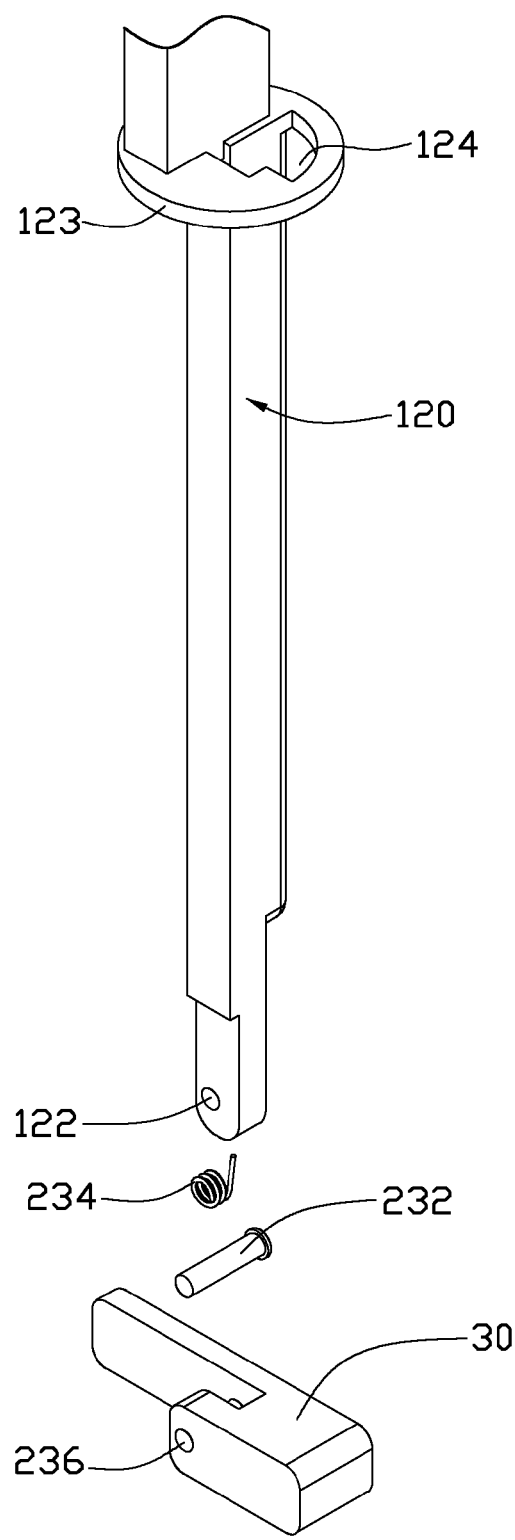
FIG. 3 is a view enlarging a portion of the fixing device in FIG. 2.

Referring to FIGS. 2-3, the fixing device 100 includes a main body 10, a biasing member 20 movably mounted on the main body 10, a hook member 30 rotatably connected to the main body 10, and an operating member 40 slidably mounted to the main body 10. The operating member 40 is used to drive the hook member 30 to rotate between a locked position and an unlocked position.

The main body 10 includes a first main frame 110 and four first legs 120 extending respectively downward and vertical from four corners of the first main frame 110. The first main frame 110 may be substantially rectangular, and includes four first frame members 111 serially and coplanarly interconnected. Each first leg 120 has an end portion 121 away from the first main frame 110. The end portion 121 further defines a first through hole 122 (see in FIG. 3). Each first leg 120 further includes a stopping member 123. The stopping member 123 is adjacent to the first frame 110. Each stopping member 123 further defines a first opening 124, such that the operating members 30 can extend through the first openings 124 to slide relative to the main body 10. Furthermore, two operating portions 112 may respectively protrude integrally from two opposite first frame members 111 for facilitating the pressing of the main body 10 by external force. The operating portions 112 extend in reverse directions.

Figure 4:
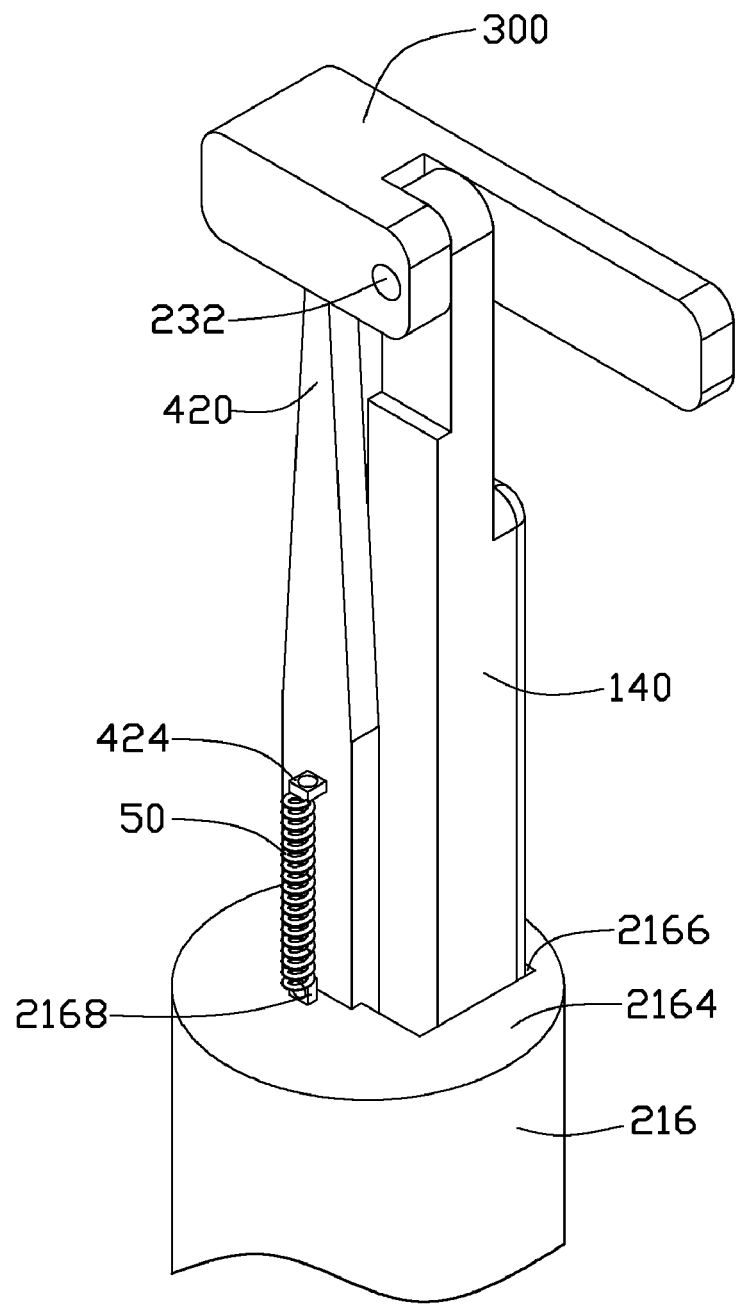
FIG. 4 is an enlarged sectional view of the fixing device in FIG. 1.

Referring also to FIG. 4, the biasing member 20 (see FIG. 2) includes a resisting portion 210 and four first elastic elements 220. The resisting portion 210 includes a second main frame 212 and four second legs 214 extending respectively downward and vertical from four corners of the second main frame 212. The shape of the second main frame 212 is similar to that of the first main frame 110, but the size of the second main frame 212 is slightly less than that of the first main frame 110. The second main frame 212 includes four second frame members 211 serially and coplanarly interconnected. Each second leg 214 is provided with a hollow cylinder 216. The hollow cylinder 216 is arranged away from the second main frame 212. Each hollow cylinder 216 includes a bottom wall 2164. The bottom wall 2164 defines a second opening 2166 for allowing the first legs 120 and third legs 420 to extend through. A connecting portion 2168 further protrudes from an outer surface of the bottom wall 2164.

The first elastic elements 220 are respectively accommodated within the cylinders 216. An end of each first elastic element 220 is fixed to an interior surface of bottom wall 2164, and an opposite end is fixed to the stopping member 123, such that the biasing member 20 is connected to the main body 10 and movable relative to the main body 10.

The hook members 30 may be substantially L-shaped. The length of each hook member 30 is larger than the diameter of the first and second holes 82, 92. Each hook member 30 defines a second through hole 236. A pivot rod 232 (see FIG. 3) extends through the second through hole 236 and the first through hole 122 to rotatably connect the hook member 30 to the main body 10. A restoring spring 234 (see FIG. 3) sleeves on the pivot rod 232 with opposite ends respectively connected to the hook member 30 and the end portion 121 of the first leg 120. Thus, the hook member 30 automatically returns to the original position if there is no external force. In the embodiment, the hook members 30 are perpendicular to the first legs 120 when the hook members 30 are in the original position.

The operating member 40 (see FIG. 2) is movably mounted on the main body and is used to rotate the hook member 30. The operating member 40 includes a third main frame 410 and four third legs 420 extending respectively downward and vertical from four corners of the third main frame 410. The shape of the third main frame 410 is similar to that of the first and second main frames 110 and 212, but the size of the third main frame 410 is slightly less than that of the second main frame 212. The third main frame 410 includes four third frame members 411 serially and coplanarly interconnected. The third legs 420 are capable of extending through the first and second openings 124 and 2166 to rotate the hook members 30. Thus, when the third legs 420 are pressed downward, the hook members 30 are driven to rotate.

In the embodiment, the fixing device 100 includes four second elastic elements 50. A protrusion 424 protrudes from each third leg 420. Opposite ends of the second elastic element 50 are respectively fixed to the protrusion 242 and the connecting portion 2148, such that the operating member 40 is elastically connected to the biasing member 20.

Referring to FIG. 4, to assemble the fixing device 100: first, the first elastic element 220 is received in the hollow cylinder 216 with one end fixed to the inner surface of the bottom wall 2164. Second, the first legs 120 extend through the corresponding hollow cylinders 216, and the stopping member 123 is slidably received in the hollow cylinder 216 and is connected to the opposite end of the first elastic element 220. Then, the hook members 30 are respectively rotatably connected to the end portion of the first legs 120 by virtue of the pivot rods 232 cooperating with the restoring spring 234, at the same time, by the force of the restoring spring 234, the hook members 30 are perpendicular to the first legs 120 while being in the original state. Finally, the third legs 420 of the operating member 40 extend through the first and second openings 124 and 2166 to resist against the hook members 30 and are elastically connected to the biasing member 20 by virtue of the second elastic element 50.

After the fixing device 100 is assembled, when the operating member 40 drives the hook members 30 to rotate to be parallel to the first legs 120, the first legs 120, the third legs 420 and the hook members 30 are capable of extending through the first and second holes 82, 92.

Figure 5:
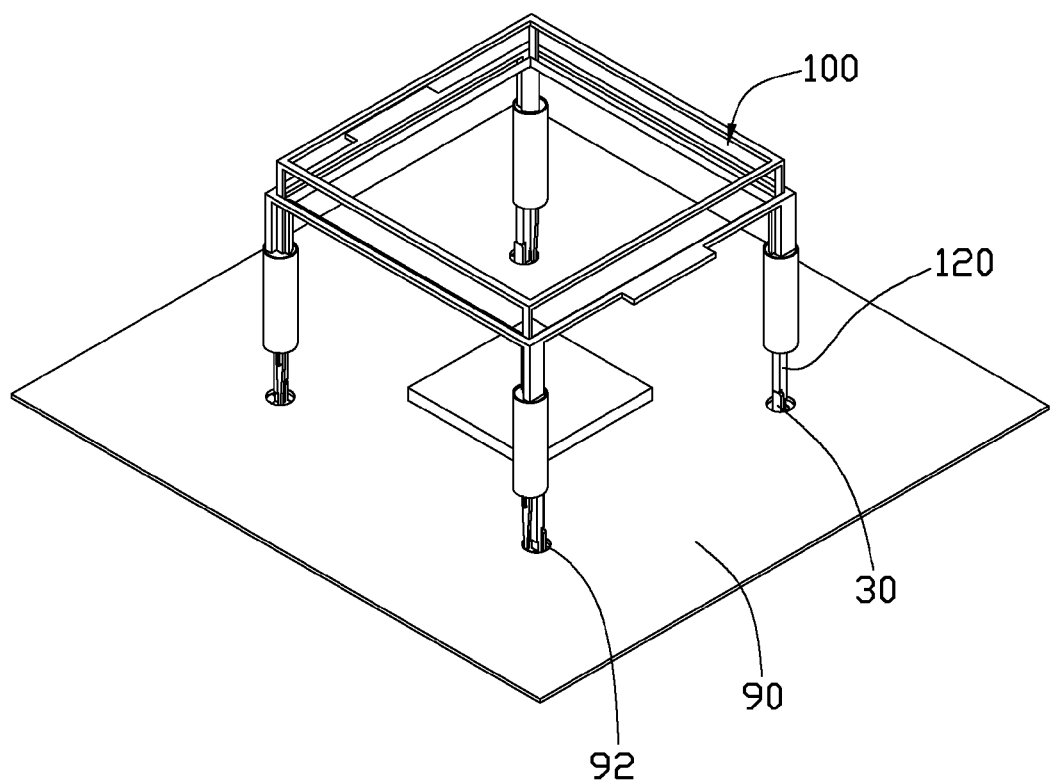
FIG. 5 is a perspective view showing the fixing device being fixed to the circuit board in FIG. 1.
Figure 6:
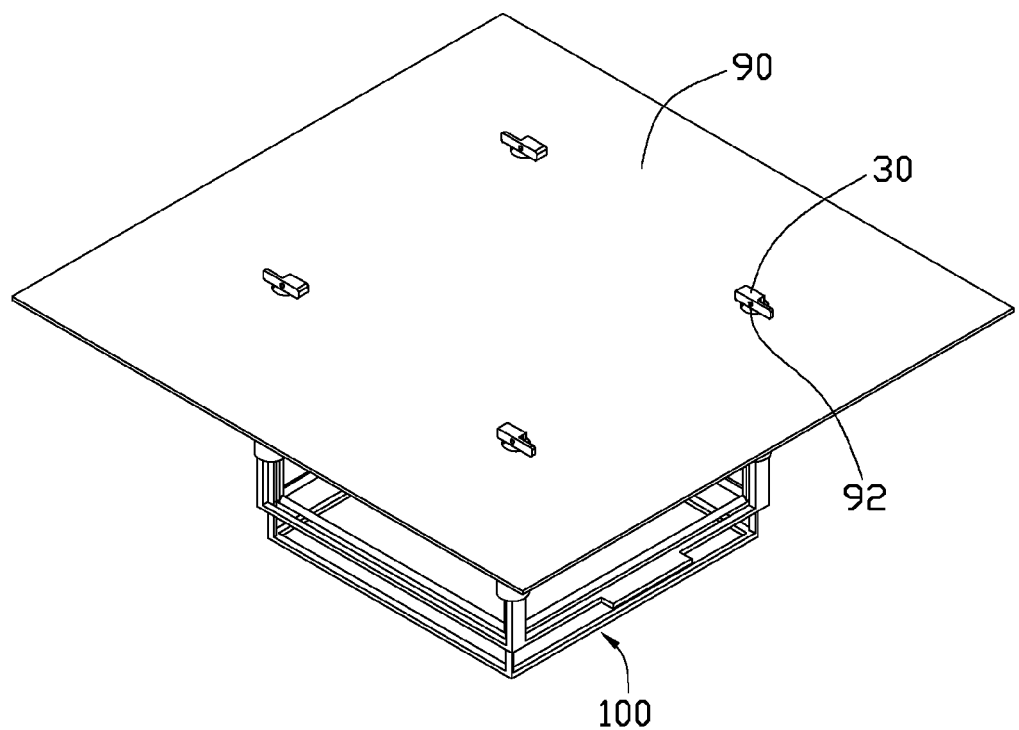
FIG. 6 is a perspective view showing the fixing device being latching to the circuit board in FIG. 1.

Referring to FIGS. 5-6, to assemble the heat sink assembly 200: first, the operating member 40 is pressed downwardly to drive the hook members 30 to rotate to be parallel to the first legs 120. Second, the operating portions 112 are pressed downward to compress the first elastic element 220, such that the hook members 30 extend out of the first and second holes 82, 92. Then, the operating member 40 and the operating portions 112 are released in order, the hook members 30 return to the original state and are perpendicular to the first legs 120, and the first elastic elements 220 rebound. Because the length of each hook member 30 is longer than the diameter of the second holes 92, thus, the heat sink 80 and the circuit board 90 are sandwiched between the hook members 30 and the bottom wall 2164 of the hollow cylinders 216. As a result, the heat sink 80 is fixed to the circuit board 90.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A fixing device for fixing a first element to a second element, the fixing device comprising:
    a main body comprising at least one first leg;
    at least one biasing member movably mounted on the at least one first leg for generating a compressive force;
    at least one hook member rotatably connected to an end of the at least one first leg, and capable of cooperating with the biasing member to fix the first element to the second element; and
    an operating member movably mounted on the main body for driving the at least one hook member to rotate relative to the end of the at least one first leg.

2. The fixing device as claimed in claim 1, wherein the main body further comprises a first main frame, and the at least one first leg extends downwardly from the first main frame.

3. The fixing device as claimed in claim 1, wherein the fixing device further comprises at least one restoring spring disposed between the at least one hook member and the end portion of the at least one first leg.

4. The fixing device as claimed in claim 1, wherein the at least one biasing member comprises a second main frame, at least one second leg extending downward from the second main frame, and at least one first elastic element connecting the at least one second leg with the at least one first leg, and the at least one second leg is slidably mounted on the at least one first leg.

5. The fixing device as claimed in claim 4, wherein the at least one first leg comprises a stopping member adjacent to the first main frame, and the at least one second leg is connected to the stopping member of the at least one first leg.

6. The fixing device as claimed in claim 5, wherein the at least one second leg comprises a hollow cylinder slidably sleeved on the at least one first leg and the at least one first elastic element.

7. The fixing device as claimed in claim 6, wherein the hollow cylinder comprises a bottom wall defining an opening for allowing the at least one first leg extending therethrough, and the at least one first elastic element is disposed within the hollow cylinder with opposite ends thereof connected to the bottom wall of the hollow cylinder and the stopping member of the at least one first leg respectively.

8. The fixing device as claimed in claim 1, wherein the operating member comprises a third main frame and at least one third leg extending downward from the third main frame, and the at least one third leg is slidably mounted on the at least one first leg and capable of moving forward and backward relative to the at least one first leg along a direction parallel to the longitudinal axis of the at least one first leg for driving corresponding hook member to rotate between a locked position and an unlocked position.

9. The fixing device as claimed in claim 1, wherein the fixing member further comprises at least one second elastic elements connecting the operating member with the at least one biasing member.

10. A heat sink assembly, comprising:
    a heat sink;
    a circuit board; and
    a fixing device connecting the heat sink to the circuit board, the fixing device comprising a main body comprising at least one leg, at least one biasing member movably mounted on the at least one leg for generating a compressive force, at least one hook member rotatably connected to an end of the at least one leg, and an operating member movably mounted on the main body for driving the at least one hook member to rotate relative to the end of the at least one first leg, the at least one biasing member compressing the heat sink and the circuit board against the at least one hook member, whereby the heat sink being connected to the circuit board.

11. The heat sink assembly as claimed in claim 10, wherein the main body further comprises a first main frame, and the at least one first leg extends downwardly from the first main frame.

12. The heat sink assembly as claimed in claim 10, wherein the fixing device further comprises at least one restoring spring disposed between the at least one hook member and the end portion of the at least one first leg.

13. The heat sink assembly as claimed in claim 10, wherein the at least one biasing member comprises a second main frame, at least one second leg extending downward from the second main frame, and at least one first elastic element connecting the at least one second leg with the at least one first leg, and the at least one second leg is slidably mounted on the at least one first leg.

14. The heat sink assembly as claimed in claim 13, wherein the at least one first leg comprises a stopping member adjacent to the first main frame, and the at least one second leg is connected to the stopping member of the at least one first leg.

15. The heat sink assembly as claimed in claim 14, wherein the at least one second leg comprises a hollow cylinder slidably sleeved on the at least one first leg first elastic element.

16. The heat sink assembly as claimed in claim 15, wherein the hollow cylinder comprises a bottom wall defining an opening for allowing the at least one first leg extending therethrough, and the at least one first elastic element is disposed within the hollow cylinder with opposite ends thereof connected to the bottom wall of the hollow cylinder and the stopping member of the at least one first leg respectively.

17. The heat sink assembly as claimed in claim 10, wherein the operating member comprises a third main frame and at least one third leg extending downward from the third main frame, and the at least one third leg is slidably mounted on the at least one first leg and capable of moving forward and backward relative to the at least one first leg along a direction parallel to the longitudinal axis of the at least one first leg for driving corresponding hook member to rotate between a locked position and an unlocked position.

18. The heat sink assembly as claimed in claim 10, wherein the fixing member further comprises at least one second elastic elements connecting the operating member with the at least one biasing member.

* * * * *